United States Patent [19]

Naka et al.

[11] Patent Number: 4,927,068
[45] Date of Patent: May 22, 1990

[54] METHOD FOR HEATING A PATTERNED SUBSTRATE

[75] Inventors: Hiroyuki Naka, Osaka; Tomohide Hirono, Hirakata; Naoki Suzuki, Sakai; Takashi Ichiyanagi, Hirakata, all of Japan

[73] Assignee: Matsushita Electric Industrial Co., Ltd., Kadoma, Japan

[21] Appl. No.: 288,876

[22] Filed: Dec. 23, 1988

[30] Foreign Application Priority Data

Dec. 25, 1987 [JP] Japan .................... 62-330721

[51] Int. Cl.⁵ .................... B23K 1/12; B23K 1/19
[52] U.S. Cl. .................... 228/103; 228/180.2; 228/222; 228/242
[58] Field of Search .......... 228/103, 180.1, 180.2, 228/222, 242; 219/85.12, 85.13

[56] References Cited

U.S. PATENT DOCUMENTS

| | | | |
|---|---|---|---|
| 3,509,317 | 4/1970 | Valsamakis et al. | 219/85.12 |
| 3,588,425 | 6/1971 | Erickson | 228/242 |
| 4,698,774 | 10/1987 | Abe et al. | 219/85.12 |
| 4,771,929 | 9/1988 | Bahr et al. | 228/180.2 |

FOREIGN PATENT DOCUMENTS 208893  10/1985  Japan .................... 228/180.2

Primary Examiner—Richard K. Seidel
Assistant Examiner—Samuel M. Heinrich
Attorney, Agent, or Firm—Cushman, Darby & Cushman

[57] ABSTRACT

A method for heating a patterned substrate having electronic components, using a heat control mask having plural apertures is disclosed. Heat transfer rates associated with the apertures are determined by thermodynamic analysis based on the discrete two-dimensional heat conduction equation treating heat from the heater as an advection.

2 Claims, 11 Drawing Sheets

METHOD FOR HEATING A PATTERNED SUBSTRATE

BACKGROUND OF THE INVENTION

1. Field of the Invention

The present invention relates to a method for heating a patterned substrate, and particularly to a method for heating the patterned substrate in reflow soldering process.

2. Description of the Related Art

In high integration mounting of electronic components on a printed circuit board substrate (hereinafter substrate), a reflow soldering process is becoming widely used in recent years. The reflow soldering process, apart from the conventional flow-process to dip a substrate with the electronic components thereon into a solder bath, is carried out by: mounting electronic component on a patterned substrate, which has been previously coated with a creamy solder paste containing fine solder powder and paste, at predetermined locations on the substrate; and subsequently irradiating the substrate by infra-red rays to heat the fine powder of solder and fuse the mounted components onto the conductive pattern on the substrate.

Figure 10:
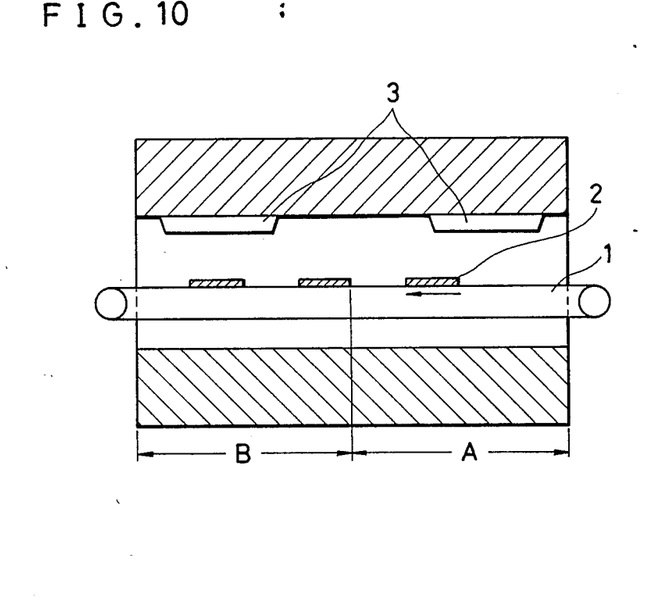
FIG. 10 is a schematic section view of a conventional general reflow furnace.

A conventional general reflow furnace is shown in FIG. 10, wherein on a belt conveyor moving at a constant speed v carries a sequence of substrates 2 having electronic components (not shown) thereon being heated by infra-red heater 3. A first part A of the furnace is a pre-heating part for heating the substrates 2 to about 160° C. A second part B of the furnace is a soldering part for heating the substrates 2 to about 250° C. to fuse the powder solder and thereby effect the soldering. The substrates 2 are thereafter cooled by a blower (not shown) and taken from the conveyor.

The above-mentioned conventional reflow substrate heating process does not necessarily provide satisfactory heating efficiency of the substrate. That is, because of differences in thermal capacity and because of nonuniform arrangements of the electronic components on the substrate, there arises temperature nonuniformity or undesirable temperature distribution. Accordingly, if the heating condition of the infra-red furnace is designed to meet the case of the electronic components of smaller heat capacities, the electronic components of larger heat capacities are heated insufficiently, thereby resulting in undesirably low temperature, resulting in insufficient soldering of the latter components. On the other hand, if the heating of the furnace is designed to meet the heat capacity of the electronic components of the larger heat capacities the components of the smaller heat capacities are excessively heated thereby resulting in thermal destruction, melting or deformation. As a conclusion, when electronic components having different heat capacities are intermixed on the substrate, the conventional reflow process may not appropriately heat the respective components to their best heating conditions at the same time.

In order to solve the above-mentioned problem, a proposal to heat the substrate with electronic components thereon, under a masking, has been disclosed in the Japanese Patent Kokai (Unexamined published patent application) Sho 60-208893. However, the method disclosed in the Japanese Patent Kokai Sho 60-208893 fails to sufficiently control the irradiation power to meet the irregularity of actual heat capacities of the components mounted on the substrate, but only applies larger slits for components of larger heat capacity and smaller slits for components of smaller heat capacity. This Kokai does not disclose concrete means to select nor define the slit size of the mask, nor does Kokai disclose a method of assessing heat capacities of the respective components for optimum selection of the irradiation control. Kokai is thus not able to predict a secondary change of temperature distribution due to secondary reaction of heat conduction on or in the substrate, and hence the design of the heat control mask has to be made in an imprecise trial and error manner.

OBJECT AND SUMMARY OF THE INVENTORY

The purpose of the present invention is to provide an improved method of heating a patterned substrate, which is suitable for desirably temperature controlling a substrate having electronic components of various different heat capacities. The present method can decrease defects in reflow soldering and thus increase productivity and product quality of the soldered substrate with components thereon.

The method for heating the patterned substrate in accordance with the present invention comprises:

(1) inserting a substrate, which has thereon a coating of creamy solder layer containing fine powdered solder and paste and has thereon plural kinds of electronic components placed on the substrate for application of reflow soldering by said fine powdered solder, through a reflow soldering by said fine powdered solder through a reflow soldering furnace having thermal radiation means; and (2) inserting, between said substrate and said thermal radiation means, a heat control mask having a number of apertures for passing the thermal radiation therethrough, the respective apertures corresponding to temperature distributions on the substrate, which is a function of (a) substrate pattern, (b) disposition of the electronic components on the substrate, (c) heat capacities of respective electronic components and heating conditions of the same.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF THE PREFERRED EMBODIMENTS

Figure 1:
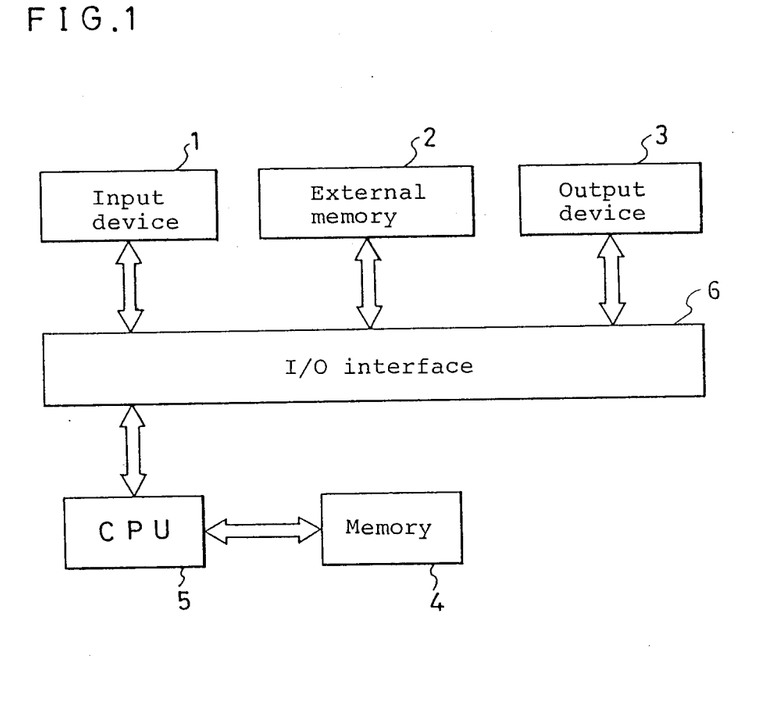
FIG. 1 is a block diagram of a first embodiment of the present invention.

Hereafter, the preferred embodiment of the present invention is described with reference to the accompanying drawings. FIG. 1 shows a block diagram of an apparatus for designing a heat control mask to be used in heating a substrate, which is a first embodiment of the invention.

The embodiment apparatus comprises:

(1) an input device 1, such as a keyboard, for inputting data of disposition and type (including type number) of electronic components for mounting on a substrate;

(2) an external memory 2 for storing "equivalent calorific capacity" (a constant for each respective electronic part, which is defined and used in thermal performance rating, as mentioned later) of respective electronic components such as resistors, capacitors, transistors, etc.;

(3) an output device 3 such as a magnetic tape writer, for outputting data, as, for example, a magnetic tape, for a NC machining system to use in manufacturing a mask;

(4) a central processing unit (CPU) 5 for obtaining the output data, which operates according a program stored in memory 4;

(5) the memory 4 storing the program for operating the CPU therein; and (6) an I/O interface 6 for connecting the above-mentioned devices.

Figure 2:
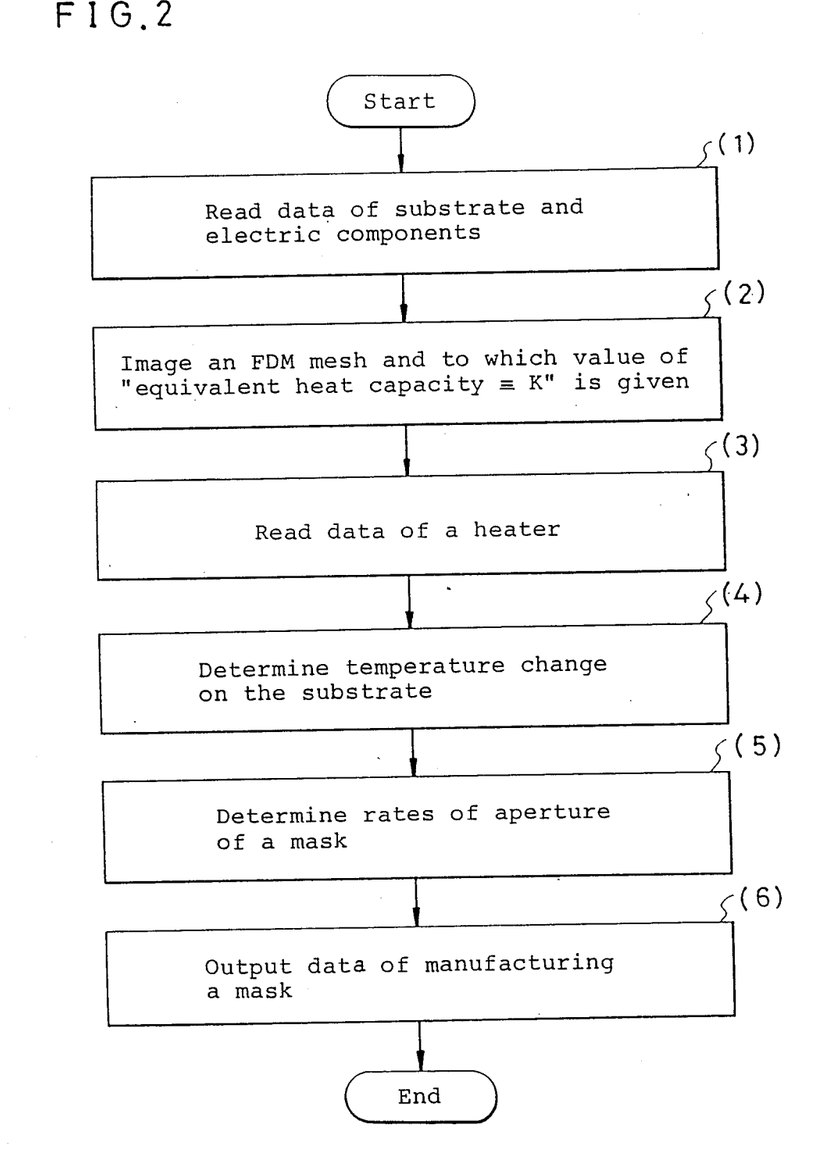
FIG. 2 is a main flow chart of a program for designing a mask used in heating a substrate.

FIG. 2 shows a main flow chart of a program stored in the memory 4, which is to be used for designing a mask used in heating the substrate.

The main program comprises:

Step (1): reading data relevant to a substrate, such as size, configuration and disposition of through-holes and also data relevant to electronic components such as respective type numbers of the components and disposition, including direction thereof;

Step (2): imaging FDM (finite difference method) meshes for discreting heat conduction equation in accordance with the above-mentioned data in step (1), so that an electronic component may have at least an FDM mesh point;

Step (3): reading data of a heater such as the temperature of the radiant heat source, the temperature of the (ambient) atmosphere, a peculiar constant α (correction heat-transfer coefficient) of the heater, a residence time ($\tau_E$) of the substrate, and the like;

Step (4): determining temperature changes on the substrate with electronic components thereon by a method of analyzing the temperature distribution on the substrate, as described later;

Step (5): determining respective heat transfer rates of the apertures of a mask, which control the amount of radiation from the heater to the substrate, a method for determination of which is stated later; and Step (6): outputting data of manufacturing a mask for NC (numerical control) machining system.

Further elucidation of step (2) is as follows:

When, for example, a capacitor has an FDM mesh point, the FDM mesh point is given a value designated "K" called an "equivalent heat capacity" of the capacitor and a K value of the substrate. When a part of the substrate has no electronic component having a FDM mesh point, it is given only the K value of the substrate.

The above-mentioned K value of each respective electronic component differs depending on the type of numbers and directions thereof. Respective K values are obtained by a method as will be stated later and the obtained K values are stored in the external memory 2 (in FIG. 1).

Hereafter items stated later are elucidated in the order of the above-mentioned steps.

Obtaining K value≡"equivalent heat capacity".

Hereafter, a method for obtaining K values of various electronic components, which are stored in the external memory 2, is described with reference to FIG. 3 and FIGS. 4(a), (b).

At first, a definition of K in the present invention in the conventional heat conduction equation is stated.

The three-dimensional heat conduction equation based on Fourier's Law is given in equation. (1).

$$\frac{\partial^2 T}{\partial X^2} + \frac{\partial^2 T}{\partial Y^2} + \frac{\partial^2 T}{\partial Z^2} = \frac{1}{K'} \frac{\partial T}{\partial \tau} \quad (1)$$

where

T: temperature $\tau$: time

K': thermal diffusivity (K' is quite different from K in the present invention.)

X,Y,Z: X-Y plane is imagined on the substrate and the Z axis is defined perpendicular to the substrate.

Because the above-mentioned equation (1) has three-dimensions, an operation of the equation (1) needs much time for calculation. To make the equation simpler, three hypotheses are introduced which lead to a two-dimensional approximation of equation (1). The three hypotheses are:

(A) Temperature distribution along the Z axis of both the substrate and electronic component is constant and temperature difference in the Z axis direction are negligibly small in comparison with temperature differences on the X-Y plane, since the substrate is of a thin shape.

(B) Heat capacity of each electronic component is expresed as a constant with regard to soldering, which is called "equivalent heat capacity≡K".

(C) Heat conduct along the Z axis is negligibly small, but it is not negligible on the X-Y plane.

If the above-mentioned three hypotheses are proper, the equation (1) is simplified to the two-dimensional heat conduction equation. And the two-dimensional heat conduction equation is discreted by the explicit FDM method. This FDM discretized equation (2) is conventional and shown in "Heat Transfer, 4th-Ed." Holman, J. P., Mc-GRAW-HILL.

$$T_{i,j}^{\tau+\Delta\tau} = \frac{\lambda \Delta \tau}{C \gamma \delta_1 \delta_2} \left\{ \frac{\delta_2}{\delta_1} (T_{i+1,j}^{\tau} + T_{i-1,j}^{\tau} - 2T_{i,j}^{\tau}) + \frac{\delta_1}{\delta_2} (T_{i,j+1}^{\tau} + T_{i,j-1}^{\tau} - 2T_{i,j}^{\tau}) \right\} + T_{i,j}^{\tau} \quad (2)$$

where $T_{i,j}^{\tau}$: the temperature of the FDM mesh point (i, j) at time $\tau$, $\Delta\tau$: a small time interval $\delta_1\delta_2$: mesh point intervals along the respective X axis and Y axis, C: specific heat of a media, λ: thermal conductivity of a media, γ: specific gravity of a media.

Equation (2) shows that the temperature of the FDM mesh point (i, j) at time $\tau + \Delta\tau$ is expressed by the temperature of the point (i, j), and contiguous points (i+1, j), (i−1, j), (i, j+1) and (i, j−1) at the time $\tau$. In the present invention, "media" refers to the substrate or the substrate having an electronic component thereon. Namely, when the FDM mesh point, (i, j) is imaged on an electronic component, the media is the substrate with the electronic component thereon. When the point (i, j) is imaged on the substrate, the media is only the substrate.

Then actual heat from the heater transfers along the Z axis during the heating of the substrate. In order to simplify the expression, the heat transfer in the present invention is expressed equation (3).

$$q(\tau) = \alpha(T_{air}^{\tau} - T_{i,j}^{\tau}) - C_{\sigma} \frac{\left(\frac{T_{i,j}^{\tau} + 273}{100}\right)^4 - \left(\frac{T_w + 273}{100}\right)^4}{\frac{1}{\epsilon_1} + \frac{1}{\epsilon_2} - 1} \quad (3)$$

where $q(\tau)$: quantity of heat flux in a unit area for a unit area for a unit time interval time interval from the heater source at every time interval $\Delta\tau$;

α: convection heat transfer coefficient, $T_{air}^{\tau}$: temperature of the (ambient) atmosphere in the heater, $T_w$: temperature of the radiant heater, $C_{\sigma}$: Stefan-Boltzmann's constant, $\epsilon_1$: emissivity of the substrate, $\epsilon_2$: emissivity of the radiating heater.

The first term in equation (3) represents the convection heat transfer, and second term represents the radiation heat transfer.

The above-mentioned heat flux $q(\tau)$ transferring along the Z axis can be introduced in the equation (2) of the two-dimensional heat conduction as is expressed by the following equation(4), in case $q(\tau)$ is imaged as a term of advection by neglecting the direction thereof. The above-mentioned introduction of $q(\tau)$ is a new concept of this invention and is proved later to be proper through experiments:

$$T_{i,j}^{\tau+\Delta\tau} = \frac{\lambda\Delta\tau}{C\gamma\delta_1\delta_2}\left\{\frac{\delta_2}{\delta_1}(T_{i+1,j}^{\tau} + T_{i-1,j}^{\tau} - 2T_{i,j}^{\tau}) + \frac{\delta_1}{\delta_2}(T_{i,j+1}^{\tau} + T_{i,j-1}^{\tau} - 2T_{i,j}^{\tau}) + \frac{\delta_1\delta_2 q(\tau)}{\lambda}\right\} + T_{i,j}^{\tau} \quad (4)$$

In case that the media is only the substrate, as discussed above, equation (4) is expressed as the following equation (4-1):

$$T_{i,j}^{\tau+\Delta\tau} = \frac{\lambda\Delta\tau}{C_R\gamma_R\delta_1\delta_2}\left\{\frac{\delta_2}{\delta_1}(T_{i+1,j}^{\tau} + T_{i-1,j}^{\tau} - 2T_{i,j}^{\tau}) + \frac{\delta_1}{\delta_2}(T_{i,j+1}^{\tau} + T_{i,j-1}^{\tau} - 2T_{i,j}^{\tau}) + \frac{\delta_1\delta_2 q(\tau)}{\lambda}\right\} + T_{i,j}^{\tau} \quad (4-1)$$

In case that the media is the substrate having the electronic component, as described, the equation (4) is expressed as the following equation (4-2):

$$T_{i,j}^{\tau+\Delta\tau} = \frac{\lambda\Delta\tau}{(C_R\gamma_R + C_s\gamma_s\delta_s/h)\delta_1\delta_2}\left\{\frac{\delta_2}{\delta_1}(T_{i+1,j}^{\tau} + T_{i-1,j}^{\tau} - 2T_{i,j}^{\tau}) + \frac{\delta_1}{\delta_2}(T_{i,j+1}^{\tau} + T_{i,j-1}^{\tau} - 2T_{i,j}^{\tau}) + \frac{\delta_1\delta_2 q(\tau)}{\lambda}\right\} + T_{i,j}^{\tau} \quad (4-2)$$

where $C_R$ and $\gamma_R$: specific heat and specific gravity of the substrate, $C_s$ and $\gamma_s$: specific heat and specific gravity of the electronic component, h: thickness of the substrate δs: representative thickness of the electronic component.

In equation (4-2), $C_s \gamma_s \delta_s$ shows the value of the "equivalent heat capacity" and this value is defined to be the K value of each electronic component. Particularly, $\delta_s$ is the substantial element of the K value, since $C_s$ and $\gamma_s$ are determined from the main material of the electronic component. On the other hand, $C_r\gamma_r$ shows the K value of the substrate.

Thus, the definition of K in the present invention has been stated. A method for obtaining or measuring the K value of each electronic component is described with reference to FIG. 3.

Figure 3:
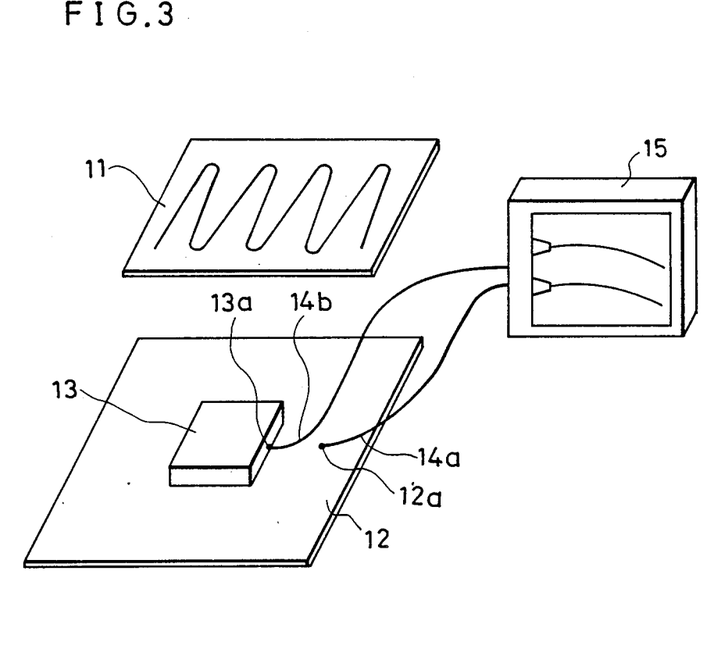
FIG. 3 is an apparatus for measuring K values of respective electronic components.
Figure 4A:
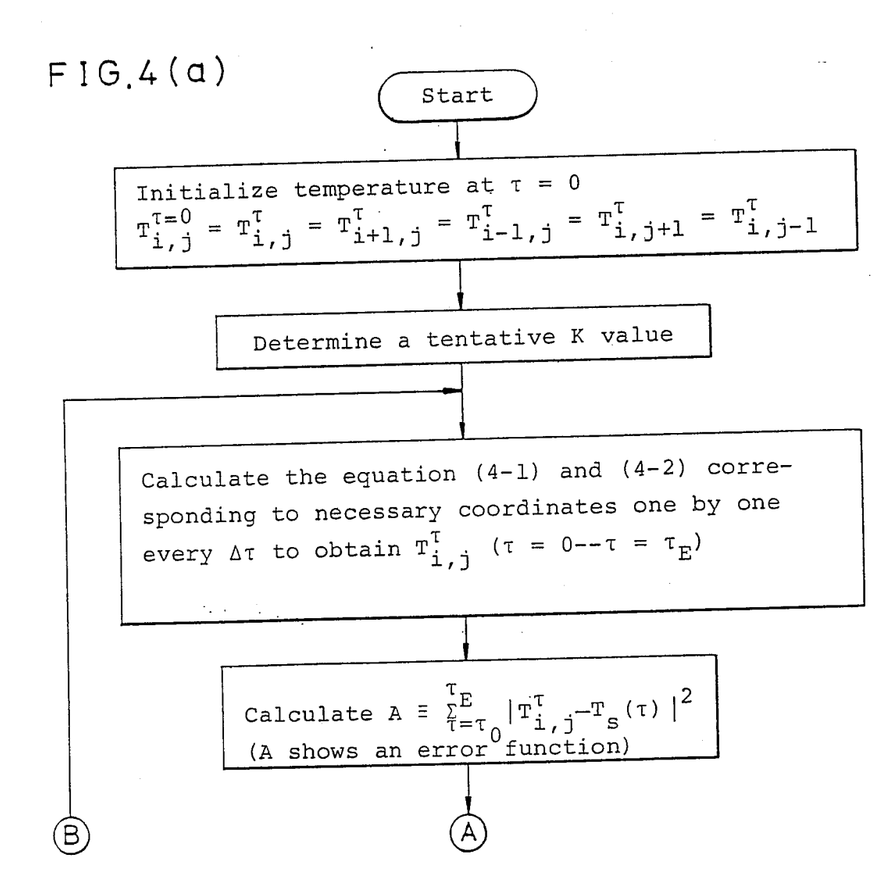
FIGS. 4(a) and (b) together show a flow chart of a process for determining K values of respective electronic components.
Figure 4B:
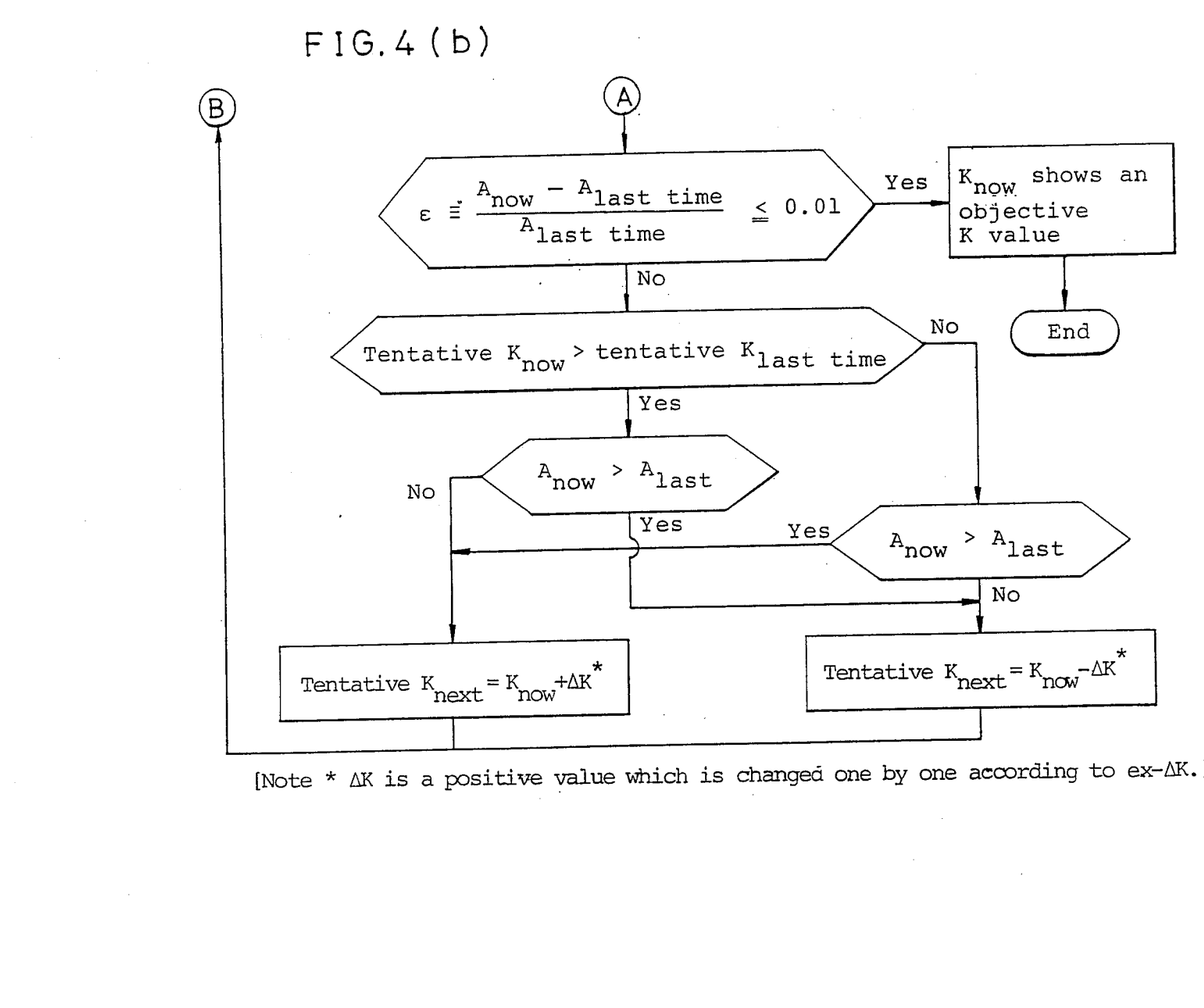

FIG. 3 shows an apparatus for measuring a K value of each electronic component. Numeral 11 designates a heat source. Numeral 12 designates a substrate. Numeral 13 designates an electronic component for which a K value is to be measured. Numerals 14a and 14b designate temperature measuring means, such as thermo-couples. Numeral 15 designates a recorder for recording the output from the thermo-couples.

Heat from the heat source 11 is controlled to keep heat on both the substrate 12 and the electronic component 13 thereon constant. Temperature changes of the substrate 12 and the electronic component 13 are measured by the thermo-couples 14a and 14b, respectively, and outputs therefrom are recorded by the recorder 15. The measuring point 12 a of the substrate is placed so as to avoid thermal influence from the electronic component 13 and the edge of the substrate. The measuring point 13a of the electronic component is placed so that the point is representative point of the electronic component such as a soldered part. The recorded chart of $T_p(\tau)$ of the measuring point 12a, shown on the recorder 15, shows the time change of the temperature of the substrate. The recorded chart $T_s(\tau)$ of the measuring point 13a, also shown on the recorder 15, shows the time change of the temperature of the electronic component on the substrate.

From the above-mentioned data, $T_p(\tau)$, the value $q(\tau)$ in equation (4) is obtainable. Because the measuring point 12a is placed as mentioned above, the measuring point 12a and contiguous points thereof have the same temperature changes. Namely:

$$T_{i,j}^{\tau} = T_{i+1,j}^{\tau} = T_{i-1,j}^{\tau} T^{i,j+1\tau} = T_{i,j-1}^{\tau}$$

is realized, and equation (5) is obtained.

$$T_{i,j}^{\tau+\Delta\tau} \frac{\Delta\tau}{C_R\gamma_R} q(\tau) + T_{i,j}^{\tau}$$

where point (i, j) represents the point 12a of FIG. 3.

In equation (5), $T_{i,j}^{\tau+\Delta\tau}$ and $T_{i,j}^{\tau}$ are determined from the data of $T_p(\tau)$, and $C_r$ and $\gamma_r$ are conventional thermodynamic constants of the material of the substrate 12, which are known. Therefore $q(\tau)$ is determined from the relation of equation (5).

Next, the K value of the electronic component 13 is obtained as described hereunder. The value $q(\tau)$ determined as mentioned above, will be effective for other measuring points, such as the point 13a, similarly to the point 12a, and is used to calculate $T_{i,j}^{\tau+\Delta\tau}$.

The following three conditions D, E and F are held. These three conditions are:

(D) $q(\tau)$ is known in the equations (4-1) and (4-2).

(E) When heating is started, all the parts of the substrate 12 and the electronic component 13 have the same temperature of the ambient atmosphere, expressed $T_{i,j}^{\tau+\Delta\tau}$. Namely:

$\tau=0$, $$T_{i,j}^{\tau}=T_{i+1,j}^{\tau}=T_{i-1,j}^{\tau}=T_{i,j+1}^{\tau}=T_{i,j-1}^{\tau}T_{i,j}^{\tau}=0$$

(F) A certain value of K can be determined once a tentative or provisional value from the constants C and $\gamma$ of the material of the electronic component 13.

Under the above-mentioned conditions, $T_{i,j}^{\tau+\Delta\tau}$ can be calculated one by one for every $\Delta\tau$ such as every 1 second, from the starting time $\tau=0$, by utilizing equations (4-1) and (4-2). Thus $T_{i,j}^{\tau}$ as a function of $\tau$ (point (i, j) is the point 13a) is obtained tentatively, and $T_{i,j}^{\tau}$ is compared with the data of $T_s(\tau)$. According to the above-mentioned comparison, the tentative K value is determined tentatively again. The above-mentioned step of tentative determination of the K value, calculation and comparison are repeated. This routine is repeated until $T_{i,j}^{\tau}$ becomes almost the same as $T_s(\tau)$. The last K value of the above-mentioned repetition is the objective K value of the electronic component 13. FIGS. 4(a) and (b) show a sample of the above-mentioned routine. K values of respective electronic components with their direction on the surface of the substrate have been obtained by the above-mentioned method and stored in the external memory 2 in FIG. 1.

Figure 5:
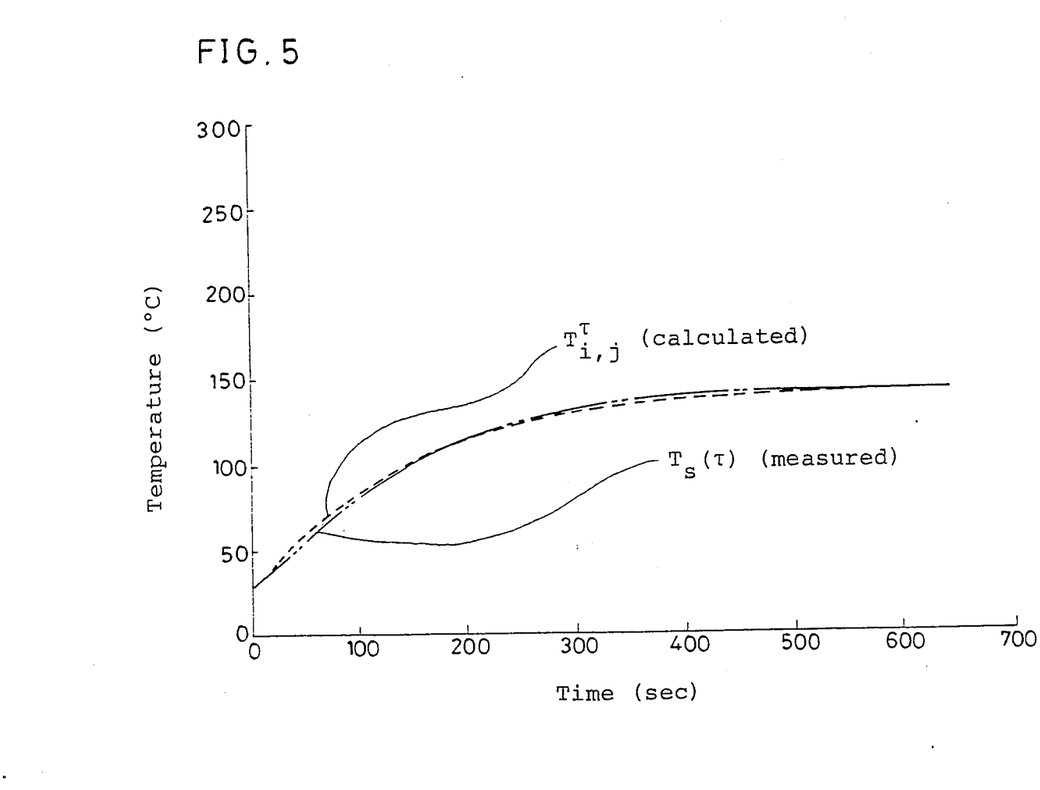
FIG. 5 is a graph of calculated $T_{i,j}{}^r$ and measured $Ts(\tau)$ of an electrolytic capacitor as an example.

FIG. 5 shows the resultant calculated $T_{i,j}^{\tau}$ and measured $T_s(\tau)$ using an electrolytic capacitor as an example electron component. Calculated $T_{i,j}^{\tau}$ is almost the same as the measured $T_s(\tau)$ in FIG. 5. Thus the above-mentioned method for obtaining the K value is proved to be proper and useful.

Obtaining the temperature change on the substrate

Hereafter, a method for obtaining the temperature change on the substrate having electronic components thereon, which method is used in step (4) (in FIG. 2) is described.

In order to obtain the above-mentioned temperature change, equations (4-1) or (4-2), corresponding to each FDM mesh point, are calculated. The constants and the initial values of the variables in the right side of equations (4-1) and (4-2) are known, as described hereunder.

In step (2) (see FIG. 2) the FDM meshes have been imaged on the substrate. K values for respective FDM mesh points are given. Thus in equations (4-1) or (4-2), corresponding to each FDM mesh, the K value of the substrate and the respective K values of the electronic components are known.

In step (3) (see FIG. 2), data relevant to the heater, such as the temperature of the heater or radiation, the temperature of the ambient atmosphere, the constant $\alpha$ of the heater and the residence time ($\tau_E$) of the substrate (or time of heating of the substrate by the heater such as determined from the speed V and the distance A or B in FIG. 10) have been read. Thus $q(\tau)$ in equations (4-1) and (4-2) is known as equation (3).

When heating is started, all FDM mesh points on the substrate and electronic components have the same temperature, which is known to be the ambient temperature.

Therefore, in equations (4-1) and (4-2), corresponding to the substrate alone and the substrate with electronic components, respectively, all FDM mesh points are calculated one by one after every $\gamma\tau$ time within the above-mentioned residence time of the substrate, and the temperature change of each of the FDM mesh points, namely the time change of the temperature for all FDM mesh points on the substrate, can be obtained.

Figure 6:
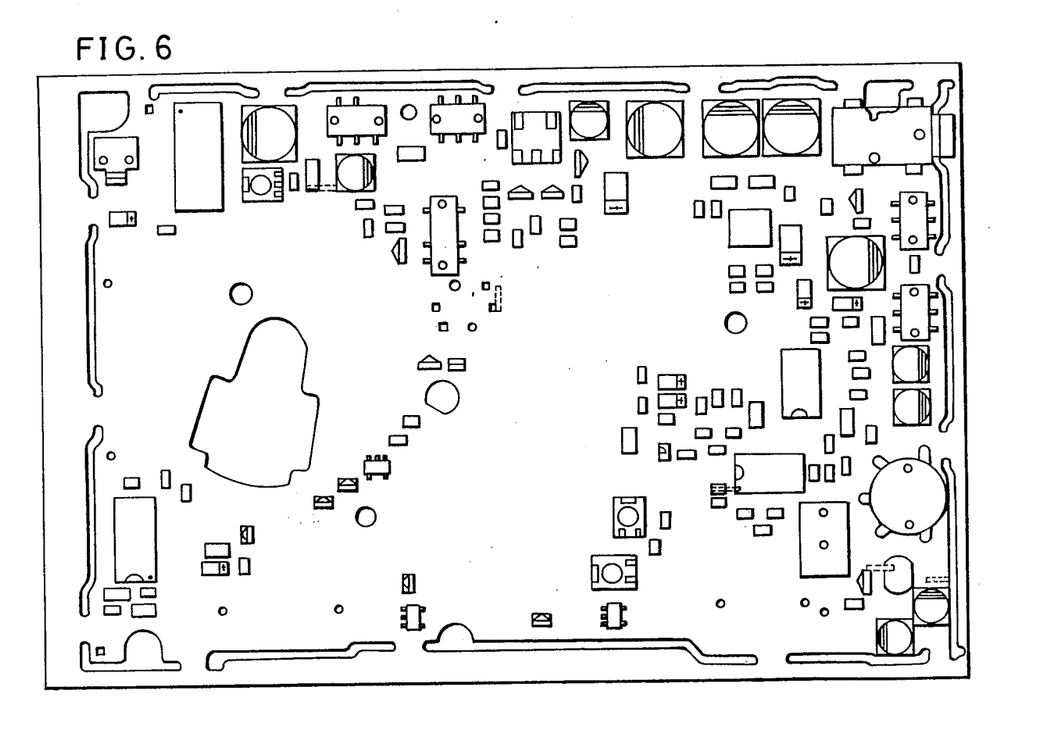
FIG. 6 is an example of a substrate.
Figure 7:
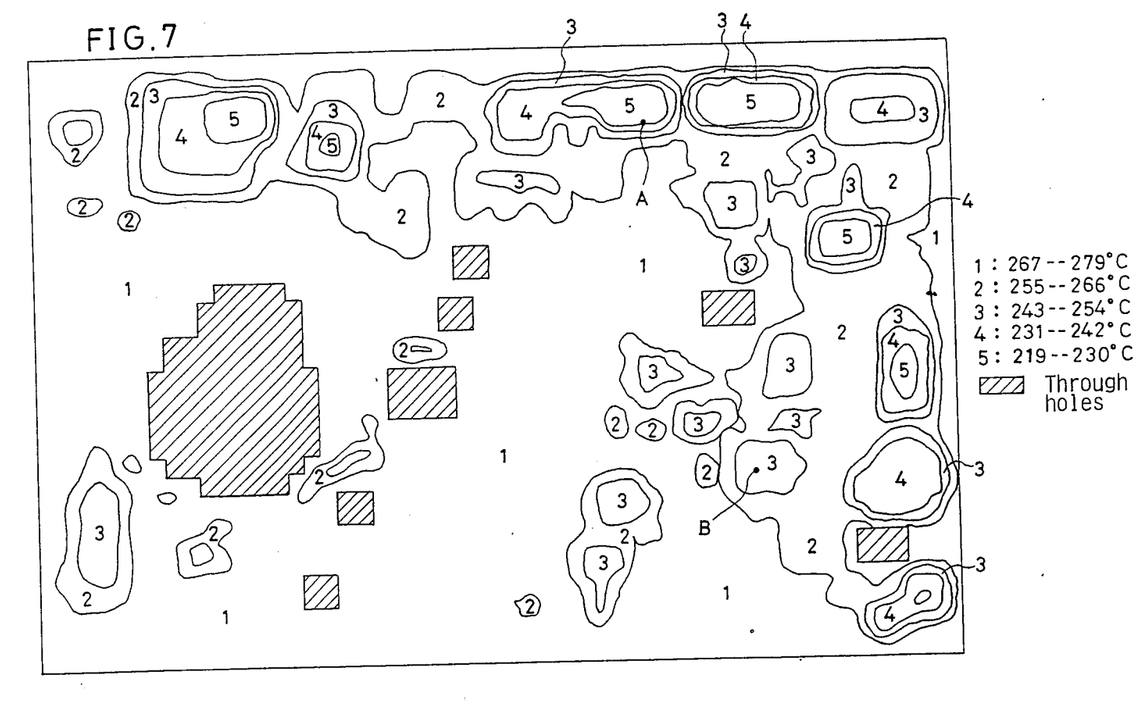
FIG. 7 is a calculated temperature distribution on the substrate.

FIG. 6 shows an example of a printed circuit board substrate, and FIG. 7 shows the temperature change on the printed board obtained by the above-mentioned method. Table 1 shows the temperature data of example points A and B shown in FIG. 7. From Table 1, the data obtained by the above-mentioned analysis and the data measured by thermo-couple measurement show good accordance.

TABLE 1

| Temperature date of example points A and B on the printed board (FIG. 7) | | |
|---|---|---|
| point | measured value | analyzed value |
| A | 226° C. | 224° C. |
| B | 252° C. | 252° C. |

A method for obtaining heat transfer rates of the apertures of a mask

Figure 8:
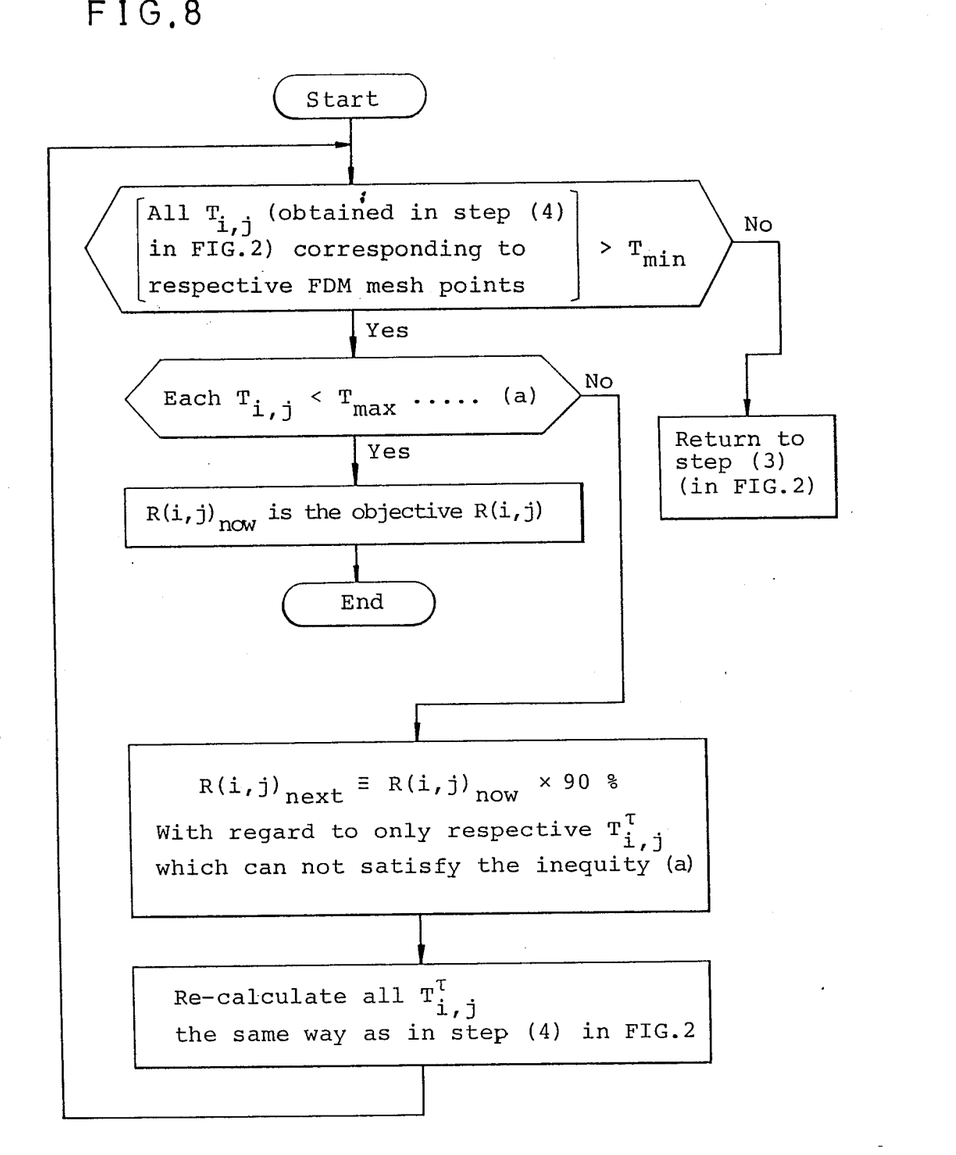
FIG. 8 is a flow chart of a process for determining $R(i, j)$ of respective apertures.

Hereafter, a method for obtaining the rate of heat transfer associated with the apertures of the mask, to be used in step (5) in FIG. 2, as a function of location on the mask, is described with reference to FIG. 8.

The heater (namely the area for radiation heat) is larger than the substrate and the distance between the mask and the substrate is very short. Therefore, the radiant heat from the heater is regarded as having parallel heat rays. The radiant heat is in proportion to the cross sectional area of an aperture.

The heat transfer rate of the apertures as a function of location on the mask is expressed as R(i,j) and is defined as a rate of heat transfer from an area of an aperture $S_0$ to an area of a respective FDM mesh point. Equation (6) is obtained:

$$R(i,j) = \frac{S_0(i,j)}{\delta_1\delta_2} . \quad (6)$$

Thus, in equation (3), the second term of the right side shows the radiation heat multiplied by the heat transfer rate R(i,j).

$$q(\tau) = \alpha(T_{air}^{\tau} - T_{i,j}^{\tau}) - \quad (7)$$

-continued $$R(i,j)C_\sigma \frac{\left(\frac{T_{i,j}^\tau + 273}{100}\right)^4 - \left(\frac{T_w + 273}{100}\right)^4}{\frac{1}{\epsilon_1} + \frac{1}{\epsilon_2} - 1} \quad 5$$

The above-mentioned $q(\tau)$ is controlled by a mask. In the step (4), the temperature change on the substrate without the mask has already been obtained. Namely, this temperature change on the substrate shows the temperature change with a mask of $R(i,j)=100\%$.

At first, it is tested whether the above-mentioned temperature change with a mask of $R(i,j)=100\%$ satisfies the following conditions:

(G) The temperature changes of all FDM mesh points are more than the fusing point of the solder ($T_{min}$).

(H) The temperature changes of each FDM mesh point is less than the allowable temeprature of the respective electronic parts ($T_{max}$) at the respective FDM points.

In a special case where the above-mentioned temperature change with a mask of $R(i,j)=100\%$ does not satisfy condition (G), the flow returns to step (3) and new heater data must be read.

Figure 9:
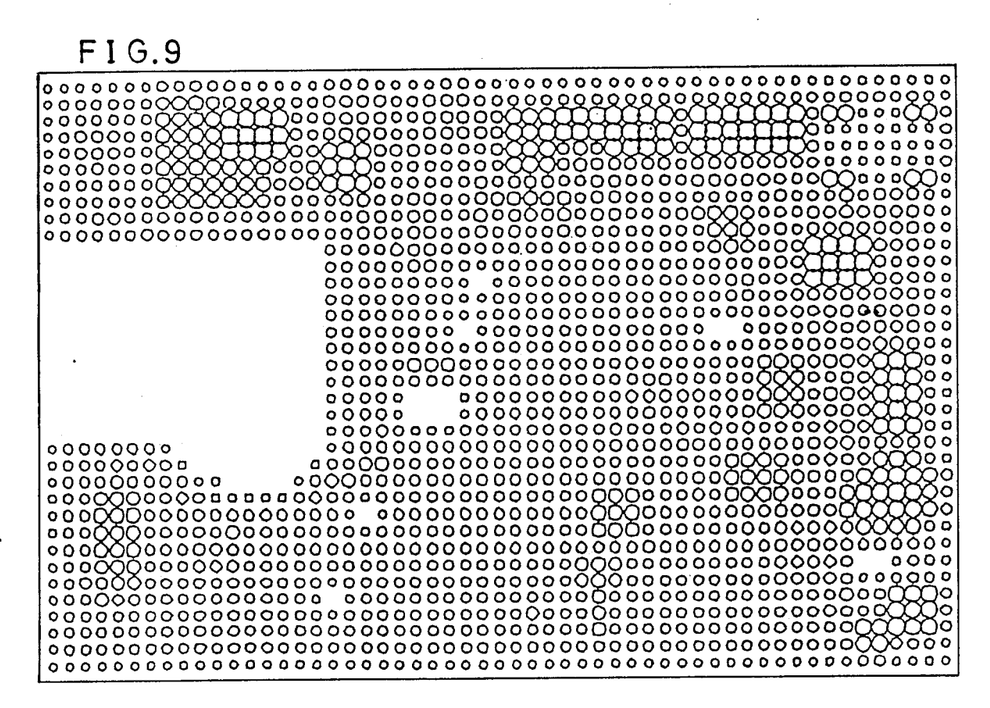
FIG. 9 is an example of a mask having apertures.

In a usual case, some FDM mesh points, which cannot satisfy condition (H) are given new values of $R(i,j)$, such as 90%, and the rest of the FDM mesh points remain at $R(i,j)=100\%$. In such a case, the next step is to utilize respective equation (6) to recalculate each FDM mesh point as mentioned in step (4). Then, the newly obtained temperature change is tested again as mentioned above. This routine is repeated until all FDM mesh points with respective values of $R(i,j)$ satisfy the above-mentioned conditions. Thus, values of $R(i,j)$ corresponding the FDM mesh points are obtained. FIG. 8 shows a sample of the above-mentioned routine. FIG. 9 shows a sample of a mask with the above-mentioned apertures. In FIG. 9 white circles show apertures.

By utilizing the above-mentioned method for thermal analysis, namely, the method of obtaining K values of the electronic parts and the method for obtaining the heat transfer rates associated with respective apertures of a mask in accordance with the present invention, optimum conditions for the reflow soldering process with high accuracy and high rationality are obtainable. An example substrate of the present invention shows a range of temperature change thereon within ±5° C., which is narrower than a conventional change within ±20° C.−±30° C. Thereby, defects of soldering caused by excess or lack of heat is reduced to about less than 1/20 in comparison with conventional arts.

Hereafter, a second preferred embodiment of the present invention is described. In this embodiment heat capacities to respective FDM mesh points are added, instead of using a mask. In order to obtain the temperature change on the substrate to satisfy the above-mentioned (B) condition, large heat capacities are added to the FDM mesh points having small K values, while small heat capacities are added to the ones having large K values. In practice, medias having the necessary amount of heat capacity to be added are put on the reverse side of the substrate having the electronic parts. In this method, $K_{add}$ (added heat capacity) is defined as the equation.

$$K_{add} = C_E \gamma_E \delta_E \quad (8),$$

where
$C_E$: specific heat of media,
$\gamma_E$: specific gravity of media,
$\delta_E$: representative thickness of media.

Because $C_E$ and $\gamma_E$ are determined by the material of the media chosen, $\delta_E$ controls the quantity of $K_{add}$. For such a case, equations (4-1) and (4-2) are changed to the following equations (9-1) and (9-2) which include $K_{add}$ ($=C_E\gamma_E\delta_E$).

$$T_{i,j}^{\tau+\Delta\tau} = \qquad (9\text{-}1)$$

$$\frac{\lambda\Delta\tau}{(C_R\gamma_R + C_E\gamma_E\delta_E/h)\delta_1\delta_2}\left\{\frac{\delta_2}{\delta_1}(T_{i+1,j}^\tau + T_{i-1,j}^\tau - 2T_{i,j}^\tau) + \frac{\delta_1}{\delta_2}(T_{i,j+1}^\tau + T_{i,j-1}^\tau - 2T_{i,j}^\tau) + \frac{\delta_1\delta_2 q(\tau)}{\lambda}\right\} + T_{i,j}^\tau$$

$$T_{i,j}^{\tau+\Delta\tau} = \qquad (9\text{-}2)$$

$$\frac{\lambda\Delta\tau}{(C_R\gamma_R + C_S\gamma_S\delta_S/h + C_E\gamma_E\delta_E/h)\delta_1\delta_2}\left\{\frac{\delta_2}{\delta_1}(T_{i+1,j}^\tau + T_{i-1,j}^\tau - 2T_{i,j}^\tau) + \frac{\delta_1}{\delta_2}(T_{i,j+1}^\tau + T_{i,j-1}^\tau - 2T_{i,j}^\tau) + \frac{\delta_1\delta_2 q(\tau)}{\lambda}\right\} + T_{i,j}^\tau$$

Respective $K_{add}$ values are obtainable by such a method for obtaining $R(i,j)$. For example, $\delta_E$ is increased from 0 mm to a certain value by steps of, for instance, 1 mm, as $R(i,j)$ is reduced from 100% to 0%, by the rate of 90% for each flow cycle as mentioned above. Therefore, respective values of $\delta_E(i,j)$ corresponding to FDM mesh points are obtained. Thus, by controlling the thickness of the heat capacity adding material, the same advantage as the use of the aperture-rate controlled mask is obtainable.

Though the above-mentioned preferred embodiments are mentioned with regard to the square FDM mesh system, the method in accordance with the present invention is applicable to a system using a triangle FDM mesh and to those using the finite element method (FEM) and the boundary element method.

With respect to the heat source, either single or plural heat source may be used and may be placed above the substrate and/or below the substrate. It is a matter of course to apply the method in the present invention to cool the substrate place by place by e.g. cold wind.

As shown with regard to a substrate having electronic components of various heat capacities in reflow soldering, the method for heating a substrate in the present invention provides the desired by optimally designing a heat control mask to enable satisfactory control of the temperature change on the substrate. According to the invention, it is possible to obtain a shape of a mask which controls the temperature change on the substrate, as desired, with high accuracy in a short period. The dispersion of the temperature on the substrate can be controlled to less than 1/5 of the conventional method, and defects of soldering can be reduced to less than 1/20 of the deflects caused by conventional methods.

Although the invention has been described in its preferred form with a certain degree of particularity, it is understood that the present disclosure of the preferred form may be changed in the details of construction and in the combination and arrangement of the parts without departing from the spirit and the scope of the invention as hereinafter claimed.

What is claimed is:

1. A method for heating a substrate, having a plurality of electronic components at coordinates (i, j) on the substrate, using a mask having a plurality of apertures, comprising the steps of
   (1) obtaining a respective heat transfer rate of an aperture associated with a respective coordinate aperture (R (i, j)) to make the temperature of the respective coordinate, as shown in the following equations (1) and (2), meet a respective desired temperature:

$$T_{i,j}^{\tau+\Delta\tau} = \frac{\lambda\Delta\tau}{(C_R\gamma_R + C_s\gamma_s\delta_s/h)\delta_1\delta_2}\left\{\frac{\delta_2}{\delta_1}(T_{i+1,j}^{\tau} + T_{i-1,j}^{\tau} - 2T_{i,j}^{\tau}) + \frac{\delta_1}{\delta_2}(T_{i,j+1}^{\tau} + T_{i,j-1}^{\tau} - 2T_{i,j}^{\tau}) + \frac{\delta_1\delta_2 q(\tau)}{\lambda}\right\} + T_{i,j}^{\tau} \quad (1)$$

$$q(\tau) = \alpha(T_{air}^{\tau} - T_{i,j}^{\tau}) - R(i,j)C_\sigma\frac{\left(\frac{T_{i,j}^{\tau} + 273}{100}\right)^4 - \left(\frac{T_w + 273}{100}\right)^4}{\frac{1}{\epsilon_1} + \frac{1}{\epsilon_2} - 1} \quad (2)$$

wherein
$T_{i,j}^{\tau}$: temeprature of a coordinate (i, j) on said substrate,
$\tau$: time
$\Delta T$: a time interval
$C_R$: specific heat of said substrate
$\lambda$: thermal conductivity said substrate
$\gamma_R$: specific gravity said substrate
$C_s$: specific heat of one of said electronic components,
$\delta_s$: representative thickness of one of said electronic components,
$\gamma_s$: specific gravity said one of electronic components,
h: thickness of the substrate,
$\delta_1, \delta_2$: long and broad length of said coordinate,
$T_{air}^{\tau}$: temperature of (ambient) atmosphere in the heater,
$\alpha$: convention heat transfer coefficient,
$T_w$: temperature of the heater,
$C_\sigma$: Stefan-Boltzmann's constant,
$q(\tau)$: quantity of heat flux in a unit area for a unit time interval from the heater source at every time interval $\Delta\tau$,
$\epsilon_1$: emissivity of said substrate,
$\epsilon_2$: emissivity of the heater,
$R_{(i,j)}$: heat transfer rate of an aperture corresponding to the coordinate area $\delta_1 \delta_2$ and (2) repeating step (1) for each of the plurality of coordinates.

2. Method of heating a substrate having a plurality of electronic components at coordinates (i, j) on the substrate, using a mask having a number of apertures for controlling heat, said mask having respective heat transfer associated with said apertures, comprising the steps of:
   obtaining an equivalent heat capacity for the electronic components by numerical analysis on the basis of temperature rise data measured under a heating condition, obtaining a temperature change on said substrate, by numerical calculation, as a function of time from (a) said equivalent heat capacity of the electronic components, (b) the disposition of said electronic components on the substrate and (c) a condition of a heater, and
   determining respective heat transfer rates associated with the apertures R(i, j) of said mask by making the temperatures of respective coordinates, as shown in the following equations (1) and (2), meet respective desired temperatures:

$$T_{i,j}^{\tau+\Delta\tau} = \frac{\lambda\Delta\tau}{(C_R\gamma_R + C_s\gamma_s\delta_s/h)\delta_1\delta_2}\left\{\frac{\delta_2}{\delta_1}(T_{i+1,j}^{\tau} + T_{i-1,j}^{\tau} - 2T_{i,j}^{\tau}) + \frac{\delta_1}{\delta_2}(T_{i,j+1}^{\tau} + T_{i,j-1}^{\tau} - 2T_{i,j}^{\tau}) + \frac{\delta_1\delta_2 q(\tau)}{\lambda}\right\} + T_{i,j}^{\tau} \quad (1)$$

$$q(\tau) = \alpha(T_{air}^{\tau} - T_{i,j}^{\tau}) - R(i,j)C_\sigma\frac{\left(\frac{T_{i,j}^{\tau} + 273}{100}\right)^4 - \left(\frac{T_w + 273}{100}\right)^4}{\frac{1}{\epsilon_1} + \frac{1}{\epsilon_2} - 1} \quad (2)$$

wherein
$T_{i,j}^{\tau}$: temperature of a coordinate (i, j) on said substrate,
$\tau$: time
$\Delta T$: a time interval
$C_R$: specific heat of said substrate,
$\lambda$: thermal conductivity said substrate,
$\gamma_R$: specific gravity said substrate
$C_s$: specific heat of one of said electronic components,
$\delta_s$: representative thickness of one of said electronic components,
$\gamma_s$: specific gravity said one of electronic components
h: thickness of the substrate,
$\delta_1, \delta_2$: long and broad length of said coordinate,
$T_{air}^{\tau}$: temperature of (ambient) atmosphere in the heater,
$\alpha$: convention heat transfer coefficient,
$T_w$: temperature of the heater,
$C_\sigma$: Stefan-Boltzmann's constant,
$R_{(i,j)}$: rate of transfer rate of an aperture corresponding to the coordinate area $\delta_1 \delta_2$,
$q(\tau)$: quantity of heat flux in a unit area for a unit time interval from the heater source at every time interval $\Delta\tau$,
$\epsilon_1$: emissivity of said substrate,
$\epsilon_2$: emissivity of the heater.

* * * * *